United States Patent
Grober et al.

(10) Patent No.: US 11,178,772 B2
(45) Date of Patent: Nov. 16, 2021

(54) COMPONENT CARRIER CONNECTED WITH A SEPARATE TILTED COMPONENT CARRIER FOR SHORT ELECTRIC CONNECTION

(71) Applicant: AT & S Austria Technologie & Systemtechnik Aktiengesellschaft, Leoben (AT)

(72) Inventors: Gernot Grober, Graz (AT); Gerald Weis, St. Marein (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 2 days.

(21) Appl. No.: 15/940,588

(22) Filed: Mar. 29, 2018

(65) Prior Publication Data
US 2019/0306988 A1    Oct. 3, 2019

(51) Int. Cl.
*H05K 1/18* (2006.01)
*H01L 21/48* (2006.01)
(Continued)

(52) U.S. Cl.
CPC .......... *H05K 1/186* (2013.01); *H01L 21/486* (2013.01); *H01L 21/4857* (2013.01); *H01L 21/568* (2013.01); *H01L 21/6835* (2013.01); *H01L 23/49833* (2013.01); *H01L 23/5385* (2013.01); *H01L 23/5386* (2013.01); *H01L 23/5389* (2013.01); *H01L 23/552* (2013.01); *H01L 23/66* (2013.01); *H01L 24/19* (2013.01); *H01L 24/24* (2013.01); *H01L 25/0652* (2013.01);
(Continued)

(58) Field of Classification Search
CPC ..... H01L 2225/06555; H01L 23/49822; H01L 23/5386; H05K 3/4611; H05K 3/4697
See application file for complete search history.

(56) References Cited

U.S. PATENT DOCUMENTS

| | | |
|---|---|---|
| 5,581,877 A | 12/1996 | Woychik et al. |
| 8,767,408 B2 | 7/2014 | Arnold et al. |

(Continued)

FOREIGN PATENT DOCUMENTS

CN    104205268 A    12/2014

OTHER PUBLICATIONS

Extended European Search Report, Application No. 19165740.2-1211, dated Aug. 21, 2019, pp. 1-8, European Patent Office, Munich, Germany.
(Continued)

*Primary Examiner* — Timothy J Thompson
*Assistant Examiner* — Rhadames Alonzo Miller
(74) *Attorney, Agent, or Firm* — Robert A. Blaha; Smith Tempel Blaha LLC (57) ABSTRACT

An electronic device includes a first component carrier with a stack of at least one first electrically conductive layer structure and at least one first electrically insulating layer structure, and a second component carrier with a respective stack of at least one second electrically conductive layer structure and at least one second electrically insulating layer structure. The second component carrier is connected with the first component carrier so that a stacking direction of the first component carrier is angled with regard to a stacking direction of the second component carrier.

18 Claims, 7 Drawing Sheets

(51) Int. Cl.
*H01L 21/56* (2006.01)
*H01L 21/683* (2006.01)
*H01L 23/538* (2006.01)
*H01L 23/552* (2006.01)
*H01L 23/66* (2006.01)
*H01L 23/00* (2006.01)
*H01L 25/065* (2006.01)
*H01L 25/00* (2006.01)
*H05K 1/02* (2006.01)
*H05K 1/09* (2006.01)
*H05K 1/11* (2006.01)
*H05K 3/00* (2006.01)
*H05K 3/40* (2006.01)
*H05K 3/46* (2006.01)
*H01L 23/498* (2006.01)
*H01L 29/16* (2006.01)

(52) U.S. Cl.
CPC ........... *H01L 25/50* (2013.01); *H05K 1/0203* (2013.01); *H05K 1/0218* (2013.01); *H05K 1/0228* (2013.01); *H05K 1/09* (2013.01); *H05K 1/112* (2013.01); *H05K 1/181* (2013.01); *H05K 3/007* (2013.01); *H05K 3/0014* (2013.01); *H05K 3/4038* (2013.01); *H05K 3/4611* (2013.01); *H05K 3/4697* (2013.01); *H01L 23/49822* (2013.01); *H01L 29/16* (2013.01); *H01L 2221/68345* (2013.01); *H01L 2224/24145* (2013.01); *H01L 2225/06517* (2013.01); *H01L 2225/06548* (2013.01); *H01L 2225/06555* (2013.01); *H01L 2225/06572* (2013.01); *H01L 2225/06589* (2013.01); *H01L 2924/1431* (2013.01); *H01L 2924/19041* (2013.01); *H01L 2924/3011* (2013.01); *H01L 2924/3025* (2013.01); *H05K 2201/0323* (2013.01); *H05K 2201/10015* (2013.01); *H05K 2201/10522* (2013.01); *H05K 2201/10545* (2013.01); *H05K 2203/1316* (2013.01)

(56) References Cited

U.S. PATENT DOCUMENTS

| | | | |
|---|---|---|---|
| 9,373,605 B1* | 6/2016 | Wang | H01L 23/49894 |
| 2003/0003705 A1* | 1/2003 | Chung | H01L 23/49822 |
| | | | 438/612 |
| 2009/0283312 A1 | 11/2009 | Takahashi | |
| 2012/0319260 A1* | 12/2012 | Kim | H01L 23/4334 |
| | | | 257/676 |
| 2015/0237729 A1 | 8/2015 | Brunschwiler et al. | |
| 2016/0066423 A1 | 3/2016 | Sakamoto et al. | |
| 2016/0343651 A1* | 11/2016 | Rae | H01L 23/3128 |
| 2017/0012030 A1* | 1/2017 | Wang | H01L 23/5385 |
| 2017/0048984 A1 | 2/2017 | Weidinger et al. | |
| 2018/0063965 A1* | 3/2018 | Leitgeb | H01L 33/62 |

OTHER PUBLICATIONS

Kästner, M.; Communication in Application No. 19 165 740.2; pp. 1-8; May 31, 2021; European Patent Office; Postbus 5818, 2280 HV Rijswijk, Netherlands.

English Translation of Notification of First Office Action in Application No. 201910245385.0; pp. 1-3; dated Aug. 30, 2021; The China National Intellectual Property Administration; No. 6, Xitucheng Lu, Jimenqiao Haidian District, Beijing City, 100088, China.

Notification of First Office Action in Application No. 201910245385.0; pp. 1-9; dated Aug. 30, 2021; The China National ntellectual Property Administration; No. 6, Xitucheng Lu, Jimenqiao Haidian District, Beijing City, 100088, China.

* cited by examiner

COMPONENT CARRIER CONNECTED WITH A SEPARATE TILTED COMPONENT CARRIER FOR SHORT ELECTRIC CONNECTION

TECHNICAL FIELD

The invention relates to an electronic device and to a method of manufacturing an electronic device.

TECHNOLOGICAL BACKGROUND

In the context of growing product functionalities of component carriers equipped with one or more electronic components and increasing miniaturization of such components as well as a rising number of components to be mounted on the component carriers such as printed circuit boards, increasingly more powerful array-like components or packages having several components are being employed, which have a plurality of contacts or connections, with ever smaller spacing between these contacts. In particular, a low loss electric connection of embedded components is desired. For example, component carriers with high input/output (I/O) count and/or high-frequency signal transmission may be critical in this respect. Moreover, there is a strong tendency in the field of component carriers of continued miniaturization. In particular, it is desired to form electrically conductive connections with smaller and smaller dimensions. Thus, conventional procedures of contacting different layers of a stacked layer-type component carrier reach their limits.

SUMMARY

There may be a need to efficiently establish electric connections in a component carrier based electronic device in a compact way.

According to an exemplary embodiment of the invention, an electronic device (such as a component carrier based package) is provided which comprises a first component carrier (for instance a printed circuit board or IC-substrate) comprising a stack of at least one (in particular a plurality of) first electrically conductive layer structure and at least one (in particular a plurality of) first electrically insulating layer structure, and a second component carrier (for instance an IC substrate) comprising a stack of at least one (in particular a plurality of) second electrically conductive layer structure and at least one (in particular a plurality of) second electrically insulating layer structure and being connected with the first component carrier so that a stacking direction of the first component carrier is angled with regard to (or is tilted with regard to or is slanted with regard to or is rotated with regard to or is at an angle with regard to or is different from) a stacking direction of the second component carrier.

According to another exemplary embodiment of the invention, a method of manufacturing an electronic device is provided, wherein the method comprises providing a first component carrier comprising at least one first electrically conductive layer structure and/or at least one first electrically insulating layer structure, and connecting a second component carrier comprising at least one second electrically conductive layer structure and/or at least one second electrically insulating layer structure with the first component carrier so that a stacking direction of the first component carrier is angled relative to a stacking direction of the second component carrier.

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a rigid or flexible printed circuit board, an organic interposer, and an IC (integrated circuit) substrate. A component carrier may also be a hybrid board combining different ones of the above mentioned-types of component carriers.

In the context of the present application, the term "layer structure" may particularly denote a continuous layer, a patterned layer or a plurality of non-consecutive islands within a common plane.

In the context of the present application, the term "stack" may particularly denote an arrangement of multiple planar layer structures which are mounted in parallel on top of or adjacent to one another.

In the context of the present application, the term "stacking direction" may particularly denote a direction according to which multiple planar layer structures are mounted in parallel on top of one another. Thus, the mentioned stacking direction may be perpendicular to a main surface of the layer structures or, in other words, may correspond to a normal vector of such a main surface.

In the context of the present application, the term "angled" may particularly denote that a stacking direction of the first component carrier and a stacking direction of the second component carrier may be different from another and may assume a non-zero angle with one another. Preferably, the angle is 90° or substantially 90° so that the two stacking directions may be perpendicular to one another.

According to an exemplary embodiment of the invention, a highly compact electric connection structure may be formed for a main or first component carrier extending in a direction different from its layer stacking direction. This may be accomplished by mechanically connecting an auxiliary or second component carrier to the first component carrier in a tilted configuration. For example, the mentioned connection may be realized by inserting the second component carrier—in a tilted state—in a cavity of the first component carrier, or by adhering the second component carrier—in a tilted state—to an exterior lateral sidewall of the first component carrier. The second component carrier may then accomplish the electric connection between constituents of the first component carrier in a slanted or preferably vertical direction making use of the then slanted at least one second electrically conductive layer structure. By taking this measure, the fact may be exploited that the formation of tiny electrically conductive structures within a plane of a layer stack is significantly easier than in a stacking direction perpendicular thereto. Forming electrically conductive connection structures within the mentioned layer plane may be accomplished in a simple way by patterning procedures enabling one to achieve electrically conductive structures such as traces with very small dimensions. Rotating such a second component carrier and attaching it to the first component carrier then allows a compact electric coupling of electrically conductive structures of the first component carrier by tilted electrically conductive structures of the second component carrier. In contrast to this, vertical electric connections in a conventional component carrier are usually formed by copper filled vias or the like which are usually larger in size and more difficult to manufacture. Inserting a (preferably 90°) tilted smaller second component carrier (for instance an IC (integrated circuit) substrate) into a cavity of a larger first component carrier (for instance a printed circuit board, PCB) allows transferring the tiny geometry of the patterned electrically conductive traces into the vertical direction, thereby accomplishing a high density vertical connection with low effort. Good results may also be obtained by attaching the (preferably 90°) rotated second component carrier to a sidewall of the first component carrier.

According to an exemplary embodiment of the invention, high density vertical connections may thus be accomplished by using the electrically conductive lines of a structured second component carrier (in particular a substrate) which is rotated preferably by 90° and is placed in a cavity or is attached to a sidewall of the first component carrier of the future electronic device. Highly preferably, the rotated second component carrier may be placed spatially nearby an integrated or embedded component in the first component carrier of the electronic device (such as a package). In such a preferred embodiment, vertical interconnects for electrically contacting such an embedded component (such as a semiconductor chip) may be established. In a nutshell, use of a structured substrate (as example for the second component carrier) may be made for forming vertical connections in a PCB (as example for the first component carrier). Hence, a large number of z-axis connections may be made with very small space consumption, so that exemplary embodiments of the invention may be particularly advantageously applied for manufacturing compact high-end packages.

OVERVIEW OF EMBODIMENTS

In the following, further exemplary embodiments of the method and the electronic device will be explained.

In an embodiment, the first component carrier has a cavity, and the second component carrier is inserted at least partially into the cavity. Correspondingly, the method may comprise forming a cavity in the first component carrier and at least partially inserting the second component carrier into the cavity. In the context of the present application, the term "cavity" may particularly denote a recess in a layer structure or in a plurality of stacked layer structures, for instance a recess in a (for example fully cured) core. For example, such a cavity may be a through hole or a blind hole. For instance, the cavity may be formed by laser drilling or mechanically drilling. It is however also possible to form a cavity by embedding a release layer in the first component carrier. Such a release layer poorly adheres to surrounding component carrier material and thereby defines a target delamination position upon separating material above such a release layer, for instance by laser cutting or mechanical cutting. A piece above the release layer may then be taken out from the first component carrier, so that the cavity is obtained. Placing the second component carrier in a cavity of the first component carrier will automatically result in a reliable mechanical protection of the sensitive second component carrier in an interior of the first component carrier. Moreover, inserting the second component carrier in a cavity of the first component carrier may allow placing the second component carrier spatially directly next to an embedded component which may therefore be contacted by the electrically conductive traces of the second component carrier in a highly efficient way and with short signal paths.

In another embodiment, the second component carrier is connected to an exterior sidewall of the first component carrier, for instance by an adhesive material. Accordingly, the method may comprise connecting the second component carrier to an exterior sidewall of the first component carrier. Such an embodiment has the advantage that any effort related to the formation of a cavity in the first component carrier may be avoided. Moreover, the procedure of exteriorly attaching and adhering the second component carrier in a 90° rotated state to a lateral sidewall of the first component carrier is a very simple procedure of establishing a desired electric connection with high density in a vertical direction.

In an embodiment, the stacking direction of the first component carrier has an angle with the stacking direction of the second component carrier in a range between 60° and 120°, in particular in a range between 80° and 100°. An arrangement with a deviation from 90° may be advantageous in terms of forming the conductive connection between the component carriers. A slightly oblique or slanted arrangement may be even preferred due to a specifically pronounced engagement between the layer structures. In particular, the stacking direction of the first component carrier is substantially orthogonal to the stacking direction of the second component carrier. For example, the stacking direction of the first component carrier may be vertical, whereas the stacking direction of the second component carrier inserted into the cavity of or attached to a sidewall of the first component carrier is horizontal. This configuration allows providing the shortest possible electric connections between vertically spaced electric contacts of the first component carrier.

In an embodiment, the at least one second electrically conductive layer structure of the second component carrier comprises an electrically conductive trace electrically connecting at least one electrically conductive structure, in particular at least two electrically conductive structures, of the first component carrier. Such an electrically conductive trace may be formed by patterning an electrically conductive layer of the second component carrier. When the mentioned electrically conductive trace is in physical contact with and extends between two electrically conductive structures of the first component carrier at different height levels, a highly compact vertical interconnection may be established. A substantially identical via shape between first component carrier and second component carrier is preferred.

In an embodiment, the second component carrier comprises a central second electrically insulating layer structure covered on both opposing main surfaces thereof by a respective second electrically conductive layer structure, wherein each of the second electrically conductive layer structures comprises a plurality of mostly parallel aligned electrically conductive traces. By such a configuration, even very complex electric connection tasks may be fulfilled in a compact way. Moreover, an impedance controlled electric connection circuitry may be provided with the mentioned configuration. Impedance may be denoted as the sum of the resistance and reactance (composed, in turn, of capacitance and inductance) of an electrical circuit. In particular in high speed AC circuits specifically the reactance can become significant. According to the described embodiment, an impedance control may be implemented by the two second electrically conductive layer structures being galvanically separated by the second electrically insulating layer structure in between. For instance, one of these two second electrically conductive layer structures may be at electric ground potential, whereas an electric signal may be guided along the remaining electrically conductive layer structure. As a result, an impedance controlled electric connection circuitry may be obtained.

In an embodiment, the second component carrier comprises at least one electrically conductive interlayer connect, in particular at least one via filled with electrically conductive material, extending between at least two second electrically conductive layer structures, in particular through a second electrically insulating layer structure of the second component carrier. By connecting different patterned electrically conductive layers of the second component carrier by at least one via filled with an electrically conductive material such as copper, the vertical interconnect functionality of the mentioned via may be converted into a horizontal coupling function after rotating the second component carrier by 90°. Thus, the electric connection circuitry may be further refined by implementing one or more vias in the second component carrier.

In an embodiment, the electronic device comprises at least one first component embedded in and/or surface-mounted on the first component carrier. In particular, the at least one first component may be electrically connected to at least one second electrically conductive layer structure of the second component carrier. Thus, the second component carrier may be implemented for electrically connecting different terminals (such as pads) of at least one preferably embedded component of the first component carrier with very small space consumption and with short current or signal paths. It may be particularly advantageous to embed both the component and the second component carrier in the same cavity of the first component carrier. This combines a simple manufacturability with a compact design and a low loss electric connection of the one or more components.

In an embodiment, the electronic device comprises at least one second component being surface-mounted on and/or embedded in the second component carrier and being inserted into the cavity of the first component carrier or being attached to the exterior sidewall of the first component carrier. Highly advantageously, also the second component carrier may be equipped with one or more embedded or surface mounted components to be inserted together with the layer stack into the cavity or to be attached together with the layer stack to a sidewall of the first component carrier. This measure allows extending the electronic functionality of the electronic device and also allows vertically embedding components into the electronic device in a space-saving way.

In an embodiment, the second component carrier comprises a continuous second electrically conductive layer, in particular sandwiched between two second electrically insulating layers. Such a continuous electrically conductive layer may contribute to a task such as shielding of electromagnetic radiation, efficiently removing heat (for instance generated by an embedded component during operation of the electronic device) out of an interior of the package-type electronic device, etc.

In an embodiment, the electronic device comprises an electromagnetic shielding structure configured for shielding electromagnetic radiation from propagating between an interior and an exterior of the electronic device. The shielding structure may be at least partially formed by at least one of the first component carrier and the second component carrier, and may be preferably formed by both the first component carrier and the second component carrier. For instance, electromagnetic radiation shielding material (for example magnetic material) of preferably both component carriers may at least partially surround an electromagnetic radiation emitting and/or electromagnetic radiation sensitive component embedded in the electronic device to reduce or even eliminate issues concerning electromagnetic interference (EMI). This may be advantageous in particular for RF applications. In particular the combination of one or more horizontal electromagnetic radiation shielding structures (such as one or more continuous layers) contributed by the first component carrier and one or more vertical electromagnetic radiation shielding structures (such as one or more continuous layers) contributed by the second component carrier may form a cage like structure being highly efficient in terms of suppressing undesired propagation of electromagnetic radiation through the electronic device.

In an embodiment, in a viewing direction along a stacking direction of the first component carrier, at least a part of sidewalls of the second component carrier has an acute angle (i.e. an angle larger than 0° and smaller than 90°), in particular an angle in a range between 10° and 80°, with a corresponding sidewall of the first component carrier. Thus, the concept of exemplary embodiments of the inventions can be very flexibly applied to many different applications. For instance, there is no need that sidewalls of the second component carrier are arranged parallel to sidewalls of the first component carrier.

In an embodiment, at least part of the at least one second electrically insulating layer structure of the second component carrier comprises at least one of the group consisting of silicon, glass, ceramic, and an organic dielectric (such as prepreg, ABF® (Ajinomoto Build-up Film) or of FR4), in particular a resin (more particularly a resin such as epoxy resin optionally with reinforcing particles such as glass fibers or glass spheres). The basic concept of exemplary embodiments of the invention may hence be flexibly applied to different materials of the component carriers. ABF is a registered trademark of the Ajinomoto Co. Inc. of Tokyo, Japan.

In an embodiment, an exposed surface of at least one of the at least one second electrically conductive layer structure of the second component carrier is covered with a corrosion protection. For instance, the second component carriers may be stored in a warehouse as vertical interconnect functionality providing constituents for manufacturing an electronic device for a longer time. In order to prevent undesired corrosion of such second electrically conductive layer structures during storage, their exposed electrically conductive layer structures (preferably made of copper) may be covered at least partially with an anti-corrosive coating. Such a coating may be configured so that it is easily removable (for instance by simple chemical treatment) directly before connecting the respective second component carrier to a first component carrier. It is also possible that the coating is automatically removed when connecting the second component carrier with the first component carrier, for instance under the influence of heat, pressure or an adhesive material accomplishing the connection.

In an embodiment, the method comprises inserting a component in the cavity next to the second component carrier, in particular placing the component in the cavity between two second component carriers with a stacking direction angled with regard to a stacking direction of the first component carrier. When using a common cavity for integrating both a component and second component carrier(s) in the first component carrier, a simple manufacturing process may be combined with a direct spatial neighbour relationship of the mentioned constituents. The latter translates, in turn, into short electric coupling paths between component and second component carrier.

In an embodiment, the method comprises fixing the second component carrier in the cavity, in particular by at least one of the group consisting of adhering the second component carrier in the cavity by adhesive, placing the second component carrier on a sticky material, equipping the second component carrier with sticky material before placing and laminating an at least partially uncured electrically insulating layer structure to the first component carrier.

In one embodiment, a (for instance liquid) adhesive may be applied in the cavity (or alternatively to a lateral sidewall of the first component carrier) prior to attaching the second component carrier to the first component carrier. Optionally, such an adhesive may also be (in particular partially) electrically conductive so as to establish an electrically conductive connection between a respective one of the first electrically conductive layer structures and a respective one of the second electrically conductive layer structures. In an embodiment, the connection may be established by at least one of the group consisting of soldering and gluing, in particular using at least one of an Anisotropic Conductive Film (ACF), and an Anisotropic Conductive Paste (ACP). An ACF is an adhesive interconnect system in the shape of a film that may be used to establish electrical and mechanical connections. ACF can be used alternatively in a paste form referred to as ACP. By taking this measure, it is possible to design a reliable electric interconnection between the electrically conductive layer structures of the component carriers without the need to involve high temperature processes. When the material of the layer structures is compatible with solder temperatures, a solder connection can be established as well.

In another embodiment, the mentioned connection can be established by laminating, i.e. the application of pressure and/or heat while using an at least partially uncured material for at least one corresponding electrically insulating layer structure. In the context of the present application, the term "at least partially uncured material" particularly denotes material which has the property to at least partially melt or become flowable by the application of elevated pressure and/or elevated temperature, and become fully hardened or cured (and thereby becomes solid) when releasing the applied elevated pressure and/or elevated temperature. Consequently, applying elevated pressure and/or elevated temperature may cause melting of the curable or at least partially uncured material, followed by an irreversible hardening upon releasing the applied high pressure and/or high temperature. In particular, the "at least partially uncured material" may comprise or consist of B-stage material and/or A-stage material. By providing the respective layer structure from resin, prepreg or any other B-stage material, the layer structure may re-melt during lamination so that resin (or the like) may flow for interconnecting the various elements and for closing gaps or voids and may therefore contribute to a stable intrinsic interconnection within the electronic device under manufacture.

In an embodiment, the method comprises connecting at least one further electrically conductive layer structure to the first component carrier and to the second component carrier for establishing an electrically conductive connection between a second electrically conductive layer structure of the second component carrier on the one hand and at least one first electrically conductive layer structure of the first component carrier and/or a component embedded in the first component carrier on the other hand. Thus, the at least one further electrically conductive layer structure may be attached to both connected component carriers to thereby bridge or close a gap between exposed respective electrically conductive layer structures of the component carriers by the at least one further electrically conductive layer structure.

In an embodiment, the method comprises forming, after inserting the second component carrier in the cavity, a further cavity in the first component carrier, and inserting a component or a third (or a further second) component carrier in the further cavity. Thus, the described principle may be applied as well to embodiments in which multiple cavities are formed in the first component carrier. Thus, a modular construction set is provided for manufacturing even complex electronic devices on a system level.

In an embodiment, the method comprises connecting the second component carrier with the first component carrier, and only thereafter forming the at least one electrically conductive layer structure of the second component. For instance, the one or more electrically conductive layer structures of the second component carrier can be applied after inserting the first component carrier in the second component carrier (for instance using a semi-additive process or SAP). Optionally, when closing the cavity (for instance in an embodiment involving lamination), a (for instance first) copper layer may be applied. For instance, the second component carrier may be free of any electrically conductive structure at the point of time of inserting the second component carrier in the first component carrier.

The at least one first or second component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, a light guide, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite base structure) or may be a paramagnetic element. However, the component may also be a further component carrier, for example in a board-in-board configuration. One or more components may be surface mounted on the component carrier(s) and/or may be embedded in an interior thereof. Moreover, also other than the mentioned components may be used as first and/or second component.

For example, the respective component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further components and being nevertheless very thin and compact.

In an embodiment, any of the component carriers as well as the electronic device is shaped as a plate. This contributes to the compact design, wherein the component carrier(s) nevertheless provide(s) a large basis for mounting components thereon. Furthermore, in particular a naked die as example for an embedded electronic component, can be conveniently embedded, thanks to its small thickness, into a thin plate such as a printed circuit board.

In an embodiment, any of the component carriers is configured as one of the group consisting of a printed circuit board, and a substrate (in particular an IC substrate). For instance, it is possible to combine two PCBs, to combine two substrates, or to combine one PCB and one substrate for forming an electronic device according to an exemplary embodiment of the invention. Preferably, the first component carrier is configured as PCB and the second component carrier is configured as IC substrate.

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

In an embodiment, dielectric material of the electrically insulating layer structures comprises at least one of the group consisting of resin (such as reinforced or non-reinforced resins, for instance epoxy resin or Bismaleimide-Triazine resin, more specifically FR-4, FR-5 or ABF®), cyanate ester, polyphenylene derivate, glass (in particular glass fibers, multi-layer glass, glass-like materials), prepreg material, polyimide, polyamide, liquid crystal polymer (LCP), epoxy-based Build-Up Film, polytetrafluoroethylene (Teflon®), a ceramic, and a metal oxide. Reinforcing materials such as webs, fibers or spheres, for example made of glass (multilayer glass) may be used as well. Although prepreg or FR4 are usually preferred, other materials may be used as well. For high frequency applications, high-frequency materials such as polytetrafluoroethylene, liquid crystal polymer and/or cyanate ester resins may be implemented in the component carrier as electrically insulating layer structure. Teflon is a registered trademark of the E.I. Du Pont De Nemours and Company of Delaware, U.S.A.

In an embodiment, the electrically conductive layer structures comprise at least one of the group consisting of copper, aluminum, nickel, silver, gold, palladium, and tungsten. Although copper is usually preferred, other materials or coated versions thereof are possible as well, in particular coated with supra-conductive material such as graphene.

In an embodiment, any of the component carriers is a laminate-type body. In such an embodiment, the respective component carrier is a compound of multiple layer structures which are stacked and connected together by applying a pressing force, if desired accompanied by heat.

The aspects defined above and further aspects of the invention are apparent from the examples of embodiment to be described hereinafter and are explained with reference to these examples of embodiment.

DETAILED DESCRIPTION OF EXEMPLARY EMBODIMENTS

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment of the invention, a package-type electronic device with high-density vertical connections may be provided which may be composed of two (or more) interconnected component carriers in different orientations.

In highly integrated package-type electronic devices, a short connection between one component and another (for instance stacked) component, in particular a semiconductor chip, is crucial. Due to the enormous amount of needed vertical connections in such a scenario, the consumed space is an important bottleneck of present package-type electronic devices. There are different approaches, for instance connecting components placed side by side, z-connections with copper filled vias and thus space consuming, etc. Each of these conventional approaches has certain limitations.

In view of the foregoing, exemplary embodiments of the invention provide a short and space saving z-axis connection architecture by using homogeneous material within a package composed of two (or more) interconnected component carriers.

A gist of an exemplary embodiment of the invention is to use electrically conductive lines of a structured second component carrier (such as an IC substrate) which is rotated by an angle of for example 90° and placed in a cavity of a first component carrier (such as a PCB), preferably nearby an integrated component of the first component carrier. As a result, a package-type electronic device with high degree of electric functionality and a compact design may be obtained. A further advantage is that the rotated second component carrier itself can have one or more electrically conductive layers, which can be electrically connected within the second component carrier. Due to the then possible direct electrical connection (without the need to form laser vias or the like) a high level of signal integrity of the board-type electronic device can be obtained. Furthermore, it is possible to place or integrate one or more components (such as semiconductor chips) on the second component carrier and/ or integrate one or more special layers for electromagnetic shielding, heat management, etc. For example, by placing one or more capacitors (as an example for a passive component) close to logic chips (as an example for an active component) such as application processors, a highly stable and reliable package-type electronic device can be realized.

Figure 8:
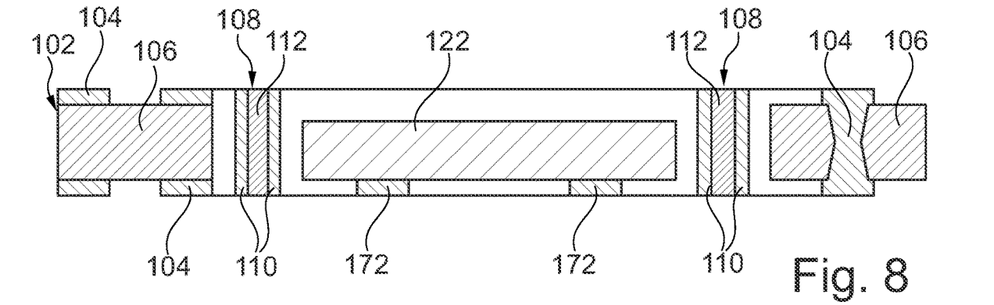
Figure 9:
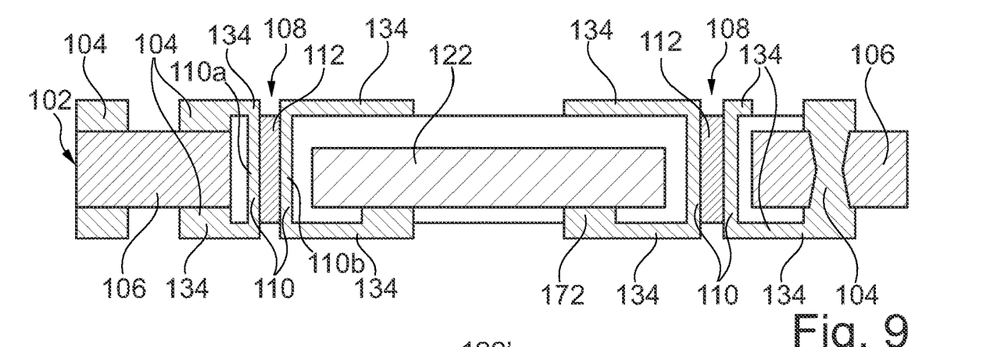
Figure 10:
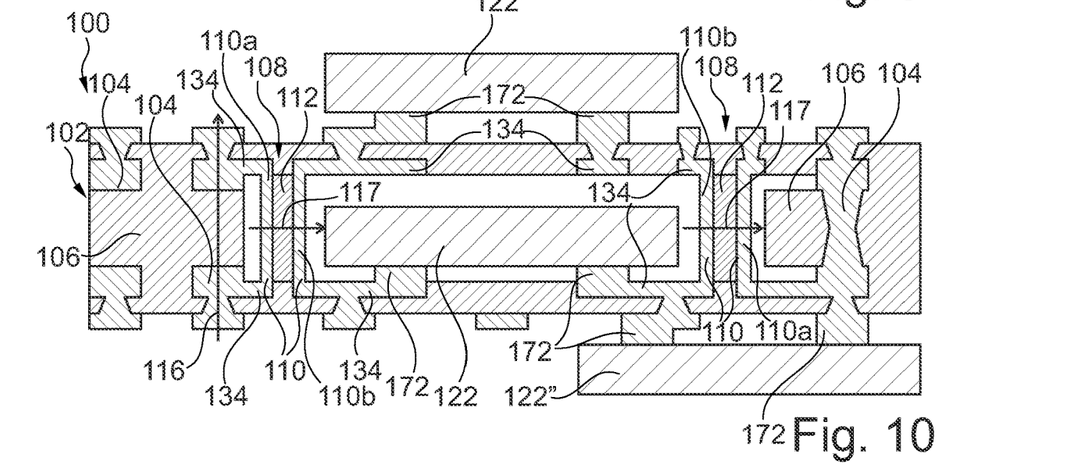

FIG. 1 to FIG. 10 illustrate cross-sectional views of structures obtained during performance of a method of manufacturing an electronic device 100, shown in FIG. 10, according to an exemplary embodiment of the invention.

Before describing this manufacturing process in detail, construction of the plate-shaped component carrier-type electronic device 100 according to the exemplary embodiment shown in FIG. 10 will be explained.

The electronic device 100 shown in FIG. 10 comprises a first component carrier 102 which is here embodied as a printed circuit board (PCB). The first component carrier 102 comprises a vertical stack of first electrically conductive layer structures 104 and first electrically insulating layer structure 106 (which may comprise epoxy resin and reinforcing glass fibers, for instance may be embodied as FR4; more generally, any appropriate ceramic materials, substrate materials, organic materials, etc., may be used). The first electrically conductive layer structures 104 are embodied as patterned electrically conductive layers (more specifically patterned copper films) as well as vertical interconnects (more specifically laser vias filled with copper). Although not illustrated in FIG. 10, the first component carrier 102 comprises a cavity 114 which can be seen, for instance, in FIG. 1.

Figures 1, 2:
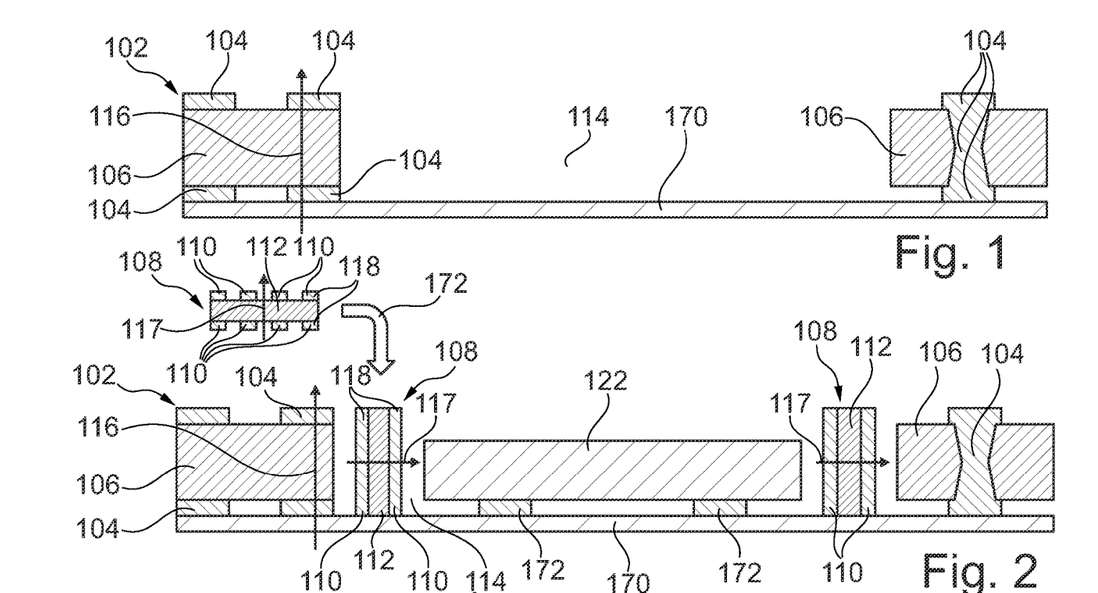
FIGS. 1, 2, 3, 4, 5, 6, 7, 8 and 9 illustrate cross-sectional views of structures obtained during performance of a method of manufacturing an electronic device shown in FIG. 10, according to an exemplary embodiment of the invention.

Two second component carriers 108, which are here embodied as IC substrates or smaller (compared to the first component carrier 102) PCBs, also form part of the electronic device 100 and have been inserted completely and in a 90° rotated orientation relative to the first component carrier 102 into the cavity 114 of the first component carrier 102 (compare FIG. 2). More precisely, an embedded component 122 (for instance a semiconductor chip) with pads 172 has been placed in the cavity 114 together with the two second component carriers 108 in a lateral sandwich configuration. Each of the second component carriers 100 also comprises a stack of second electrically conductive layer structures 110 (patterned copper foils in the present embodiment) and a second electrically insulating layer structure 112 (which may comprise epoxy resin and reinforcing glass spheres or fibers) in between. The second component carriers 108 are inserted completely into the cavity 114 of the first component carrier 102 in their 90° tilted state so that a stacking direction 116 (vertically according to FIG. 10) of the first component carrier 102 is oriented perpendicular with regard to another different stacking direction 117 (horizontally according to FIG. 10) of the second component carriers 108 (which are aligned parallel to one another).

As can be taken from FIG. 10, each of the vertically extending electrical traces of the second electrically conductive layer structures 110 of the second component carriers 108 is electrically connected to a respective pair of electrically conductive layer structures 104 of the first component carrier 102 at different vertical height levels to establish an electrically conductive connection in between.

Moreover, the central second electrically insulating layer structure 112 of each of the second component carriers 108 is covered on both opposing main surfaces thereof by a respective pair of second electrically conductive layer structures 110 which are denoted, for the sake of clarity, with reference 110*a* and 110*b*. For example, electrically conductive layer structure 110*a* may be at electric ground potential (or more generally at an electric reference potential), while an electric (for instance high-frequency) signal may propagate along electrically conductive layer structure 110*b*. By the described configuration of the second component carriers 108, impedance controlled electric connection lines are formed.

As mentioned above, the component 122 is embedded in the cavity 114 of the first component carrier 102. The component 122 is furthermore electrically connected to the second electrically conductive layer structures 110*b* of the second component carriers 108. Also laminated further electrically conductive layer structures 134 above and below the component carriers 102, 108, 108 contribute to this electric coupling. Apart from this, a further component 122' (which may also be a semiconductor chip) is surface mounted in a surface region of the electronic device 100 and is electrically connected to the embedded component 122, inter alia, by part of the second electrically conductive layer structures 110 of the second component carriers 108. As a result, an extremely short and space-saving electric connection between the vertically stacked components 122, 122' may be established by vertically tilted second electrically conductive layer structures 110 of the second component carriers 108 inserted into the cavity 114 of the first component carrier 102.

Yet another component 122" (which may be yet another semiconductor chip) is mounted on a further main surface of the electronic device 100 opposing the previously mentioned main surface of the electronic device 100 on which the component 122' is mounted. The electric connection of component 122" with the other constituents of the electronic device 100 is accomplished by the electrically conductive layer structures 104, 110, as illustrated in FIG. 10.

In the described embodiment, a highly complex high-performance vertical electric connection circuitry within the electronic device 100 is achieved by the vertically tilted second electrically conductive layer structures 110 of the second component carriers 108.

In the following, a method of manufacturing the electronic device 100 shown in FIG. 10 will be described referring to FIG. 1 to FIG. 9. This embodiment relates to a chip first architecture.

Referring to FIG. 1, a cross-sectional view of a PCB-type first component carrier 102 is shown which comprises first electrically conductive layer structures 104 (preferably made of copper) on both opposing main surfaces and extending vertically through a first electrically insulating layer structure 106 (which may comprise epoxy resin with reinforcing glass fibers). A cavity 114 is formed as a through hole extending through the electrically insulating layer structure 106. A bottom of the cavity 114 is closed by a temporary carrier 170, such as a sticky tape, attached to a lower main surface of the arrangement composed of the first electrically insulating layer structure 106 and the electrically conductive layer structures 104. Thus, FIG. 1 shows the temporary carrier 170 below a board as first component carrier 102 having the cavity 114.

Referring to an upper portion of FIG. 2, a second component carrier 108 is illustrated as a layer stack with a vertical stacking direction 117. The second component carrier 108 is composed of two second electrically conductive layer structures 110 (here embodied as copper foils which have been patterned to form a plurality of tiny and parallel aligned electrically conductive traces 118) attached to two opposing main surfaces of a second electrically insulating layer structure 112 (such as a resin film with reinforcing spheres or fibers therein). As indicated by an arrow 172, the second component carrier 108 is then tilted from a horizontal orientation into a vertical orientation and is then inserted into the cavity 114 so as to be adhesively attached to the temporary carrier 170 with a flange face of the second component carrier 108 (for instance, the illustrated second component carrier 108 may first be rotated around an axis corresponding to reference numeral 117 and may then be rotated around an axis perpendicular to the paper plane of FIG. 2). As can be taken from FIG. 2 as well, two (here identical) second component carriers 108 are inserted into the cavity 114 directly adjacent to opposing sidewalls of the first electrically insulating layer structure 106. This insertion of the second component carriers 108 in the cavity 114 is accomplished so that a vertical stacking direction 116 of the first component carrier 102 assumes an angle of 90° relative to the horizontal stacking directions 117 of the respective second component carriers 108.

Moreover, component 122 (in particular a semiconductor chip) is placed in the cavity 114 between the two second component carriers 108 and is attached as well to the sticky temporary carrier 170. Chip pads 172 are formed on a main surface of the component 122 which is attached to the temporary carrier 170. Thus, the component 122 is mounted face down in the illustrated embodiment. One and the same cavity 114 is thus used for accommodating two second component carriers 108 and the component 122.

The configuration according to FIG. 2 can be obtained by flipping and placing the substrate-type second component carriers 108 in the cavity 114 and placing the component 122 in between.

Figure 3:
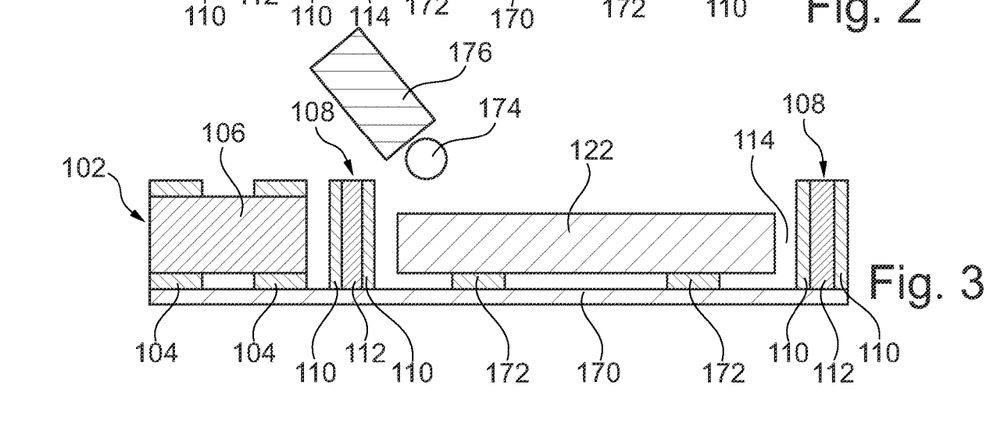

Referring to FIG. 3, remaining hollow spaces of the cavity 114 may be filled with an adhesive material 174 which may be applied, for example by a dispenser 176. Thus, according to the option shown in FIG. 3, gaps between the temporary carrier 170, the component 122 and the component carriers 102, 108, 108 may be at least partially filled with fluid material (like resin). In a subsequent procedure, the second component carriers 108 and the component 122 may be fixed in the cavity 114 by the adhesive material 174 (which may optionally be cured). Preferably, the adhesive material 174 may be thermally conductive so as to promote heat removal and heat spreading to dissipate heat generated in the interior of the readily manufactured electronic device 100 during operation of the component 122.

Figure 4:
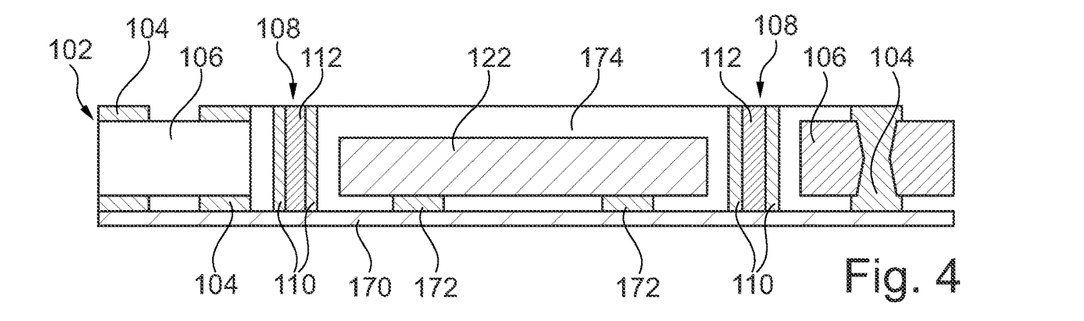

Referring to FIG. 4, a layer structure is shown which is obtained based on the structure shown in FIG. 3 after having applied the adhesive 174 into empty spaces of the cavity 114 and after having cured the adhesive 174.

Figure 5:
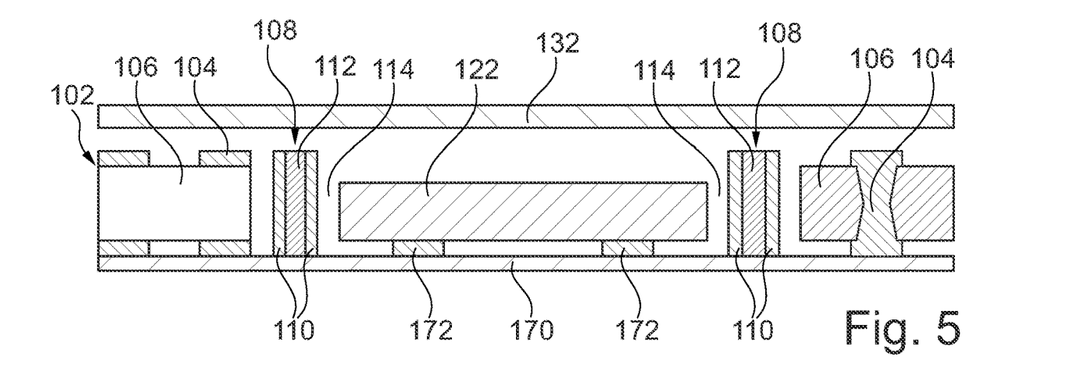

Referring to FIG. 5, another alternative to the procedure described referring to FIG. 3 and FIG. 4 will be described. According to this embodiment, the component 122 and the second component carriers 108 may be fixed in place in the cavity 114 by lamination of further a resin sheet. More specifically, an uncured electrically insulating layer structure 132 (for instance a prepreg sheet in B-stage) may be attached to an upper main surface of the arrangement shown in FIG. 2 and may be connected with the first component carrier 102, the component 122 and the second component carriers 108 by lamination, i.e. the application of heat and pressure.

Figure 6:
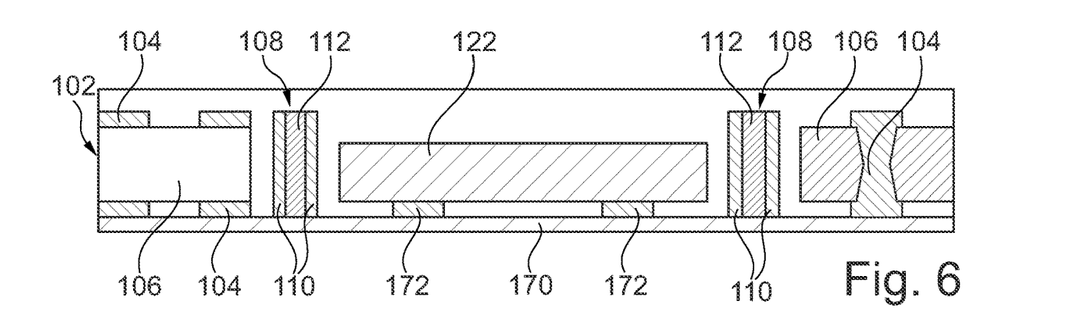

Referring to FIG. 6, an arrangement is shown which is obtained after the lamination, as described referring to FIG. 5. The previously electrically insulating layer structure 132 has now been fully cured by cross-linking the resin material as a result of the application of pressure and/or heat. Consequently, material of the electrically insulating layer structure 132 has flown into empty spaces of the cavity 114, and hardens or re-solidifies for mechanically connecting all elements shown in FIG. 6.

Figure 7:
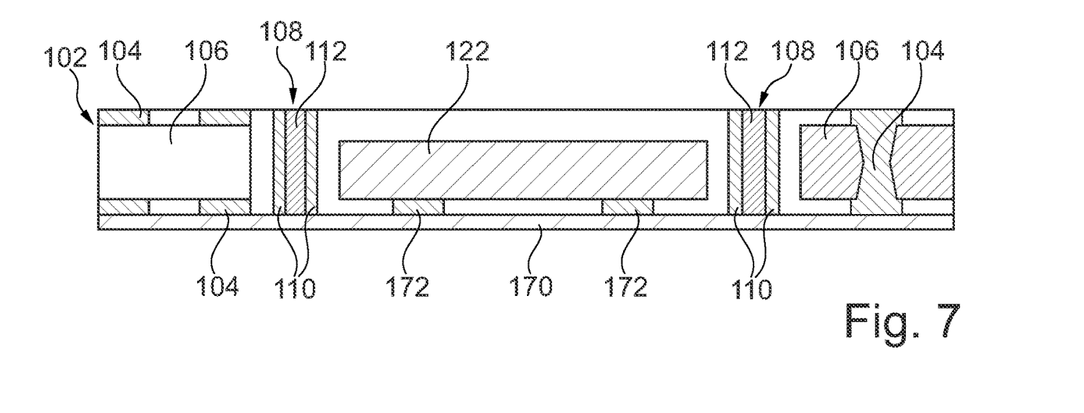

Referring to FIG. 7, electrically insulating material on the upper main surface of the structure shown in FIG. 6 may be removed, for instance by laser processing, mechanically grinding or chemically so as to expose electrically conductive material of the electrically conductive layer structures 104, 110. In other words, it is possible to uncover or clean the copper surface of the panel-flipped substrate (such a procedure can be carried out in both alternatives which have been described above referring to FIG. 3, FIG. 4 and FIG. 5, FIG. 6).

In order to obtain the structure shown in FIG. 8, it is possible to remove the temporary carrier 170. The latter is now no longer needed, since the constituents of the structure shown in FIG. 8 have now been rigidly connected by the adhesive 174 or the laminated electrically insulating layer structure 132, respectively. Thus, it is now possible to peel off the temporary carrier 170 (which can, in an alternative embodiment, also be carried out before the procedure described referring to FIG. 7).

Referring to FIG. 9, the method may further comprise connecting a respective one of further electrically conductive layer structures 134 (here embodied as patterned copper foils) to each of the two opposing main surfaces of the first component carrier 102 and the second component carriers 108 for establishing an electrically conductive connection between second electrically conductive layer structures 110 of the second component carriers 108 on the one hand and first electrically conductive layer structures 104 of the first component carrier 102 on the other hand.

For this purpose, the electrically conductive layer structures 134 may be laminated on both opposing main surfaces of the structure shown in FIG. 8 as complete metal foils which may then be patterned. Thus, it may be possible to structure the panel (preferably by adaptive imaging to obtain a proper accuracy).

The component carrier 100 according to FIG. 10 is then obtained by forming a further layer build-up, surface mounting of components 122', 122", etc.

FIG. 11 to FIG. 14 illustrate cross-sectional views of structures obtained during performance of a method of manufacturing an electronic device 100 according to another exemplary embodiment of the invention, implementing a chip last architecture.

Figure 11:
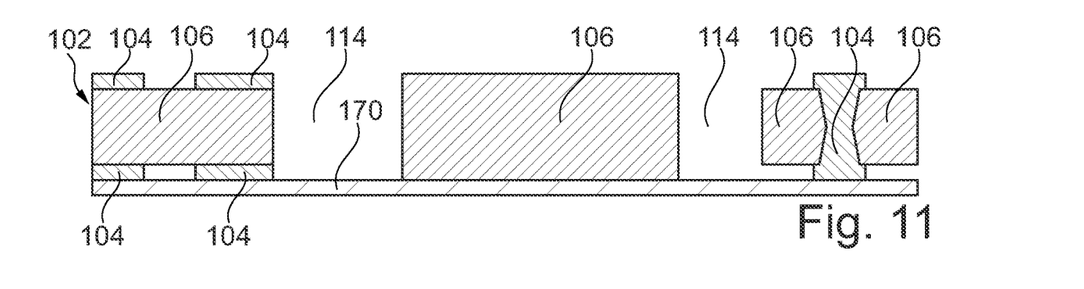
FIGS. 11, 12, 13 and 14 illustrate cross-sectional views of structures obtained during performance of a method of manufacturing an electronic device according to another exemplary embodiment of the invention.

Referring to FIG. 11, the procedure is started with a board, as first component carrier 102, on a temporary carrier 170, as described above referring to FIG. 1. However, two separate cavities 114 are formed according to FIG. 11, separated by a central section of first electrically insulating layer structure 106.

Figure 12:
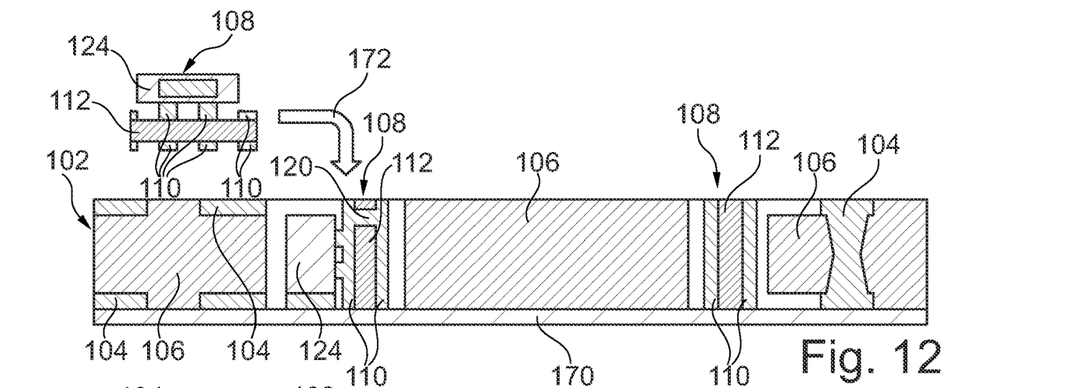

Referring to FIG. 12, each of two second component carriers 108 is placed in a respective one of the two separate cavities 114, compare description according to FIG. 2. In contrast to the embodiment described referring to FIG. 1 to FIG. 10, the presently described embodiment implements a second component carrier 108 having a respective second component 124 (such as a semiconductor chip or a passive component like a capacitor or a resistor) being surface-mounted on the second component carrier 108 and being inserted vertically tilted into the respective one of the cavities 114 of the first component carrier 102. The second component 124 may be assembled as a surface mounted device or SMD-component and may be vertically integrated in the electronic device 100 being presently manufactured. Moreover, the second component carrier 108 shown on the left-hand side of FIG. 12 comprises an electrically conductive interlayer connect 120 (embodied as via filled with electrically conductive material such as copper) extending between two patterned layer-type second electrically conductive layer structures 110. The interlayer connect 120 extends through the central second electrically insulating layer structure 112 of the mentioned second component carrier 108. When the respective second component carrier 108 is embedded in an electronic device 100, the electrically conductive interlayer connect 120 advantageously enables a layer change in the electric circuitry.

Subsequently, remaining gaps or empty volumes of the cavities 114 may be closed and the second component carriers 108 may be fixed in place by supplying adhesive 174 (as described referring to FIG. 3 and FIG. 4) and/or by laminating an uncured electrically insulating layer structure 132 to an upper main surface of the arrangement of first component carrier 100 and second component carriers 108 (as described referring to FIG. 5 and FIG. 6). The structure shown in FIG. 12 is obtained by flipping and placing the substrate-type second component carriers 108 in the cavities 114 and by filling the cavities 114.

Figure 13:
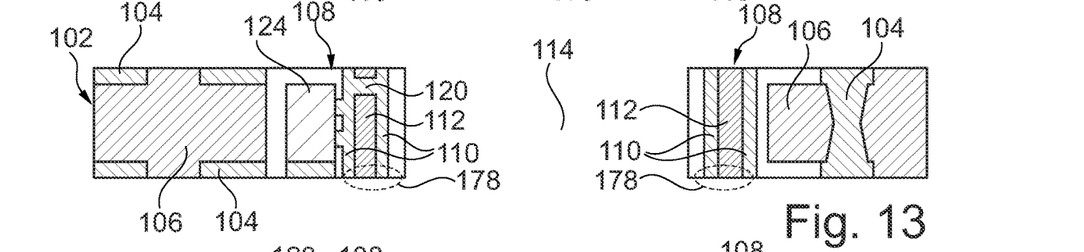

Referring to FIG. 13, a further cavity 114 for accommodating a further component 122 is formed in the structure shown in FIG. 12 between the second component carriers 108, for instance by laser processing or removing the central section of the first electrically insulating layer structure 106 in another way.

Figure 14:
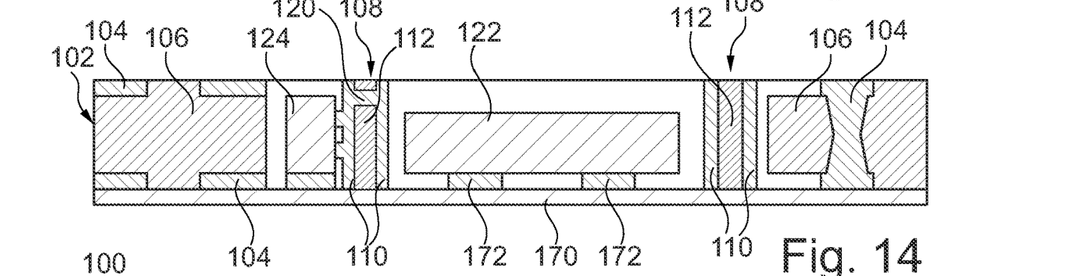

Referring to FIG. 14, the further component 122 is inserted into the further cavity 114 closed at a bottom by a sticky tape as temporary carrier 170. Remaining gaps of the further cavity 114 may be filled with adhesive 174 and/or material of an uncured electrically insulating layer structure 132 (compare description of FIG. 3 to FIG. 6 above). As a result, the further component 122 is fixed in place in the further cavity 114 so that a rigid overall structure is obtained.

Further processes may then be carried out (compare the description of FIG. 7 to FIG. 10) to thereby obtain an electronic device 100 according to an exemplary embodiment of the invention.

The presently described embodiment differs from the embodiment according to FIG. 1 to FIG. 10 in particular in that the further component 122 is assembled much later in the presently described embodiment, i.e. in a chip last architecture. This has the significant advantage that in a scenario of a problematic electric connection, for instance in a critical region 178 shown in FIG. 13, a corresponding test may be carried out based on the structure shown in FIG. 13 before having mounted the expensive further component 122 (for instance a processor). In other words, a known-good arrangement of component carriers 102, 108, 108 may be used at the point of time of mounting the further component 122 (compare FIG. 14) in the described chip last architecture.

Figure 15:
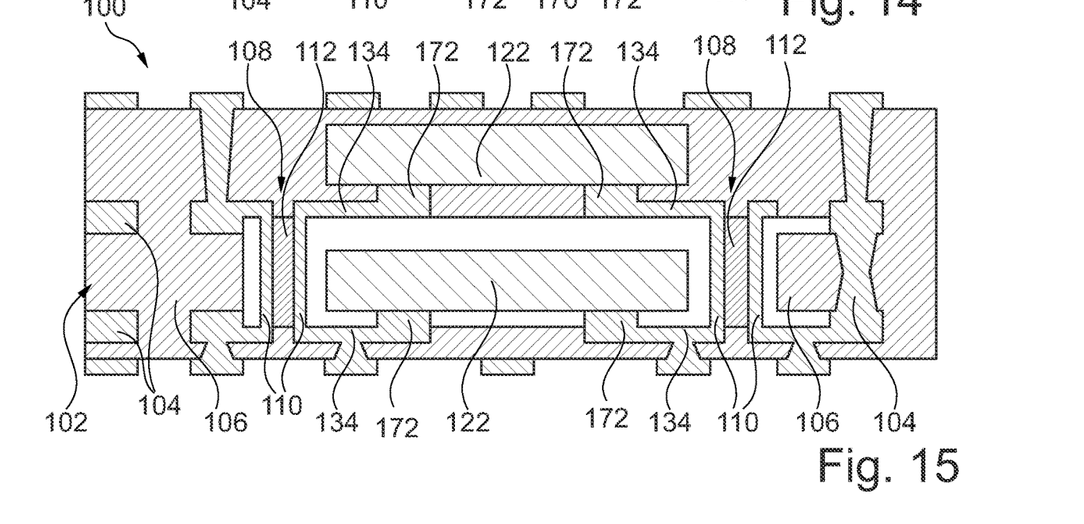
FIGS. 15, 16, 17 and 18 illustrate cross-sectional views of electronic devices according to exemplary embodiments of the invention.

FIG. 15 illustrates an electronic device 100 according to another exemplary embodiment which has two vertically stacked components 122 both embedded in an interior of the electronic device 100. The electric connection between components 122 is established, inter alia, by the second electrically conductive connection structures 112 of two second component carriers 108 in a highly compact way.

Figure 16:
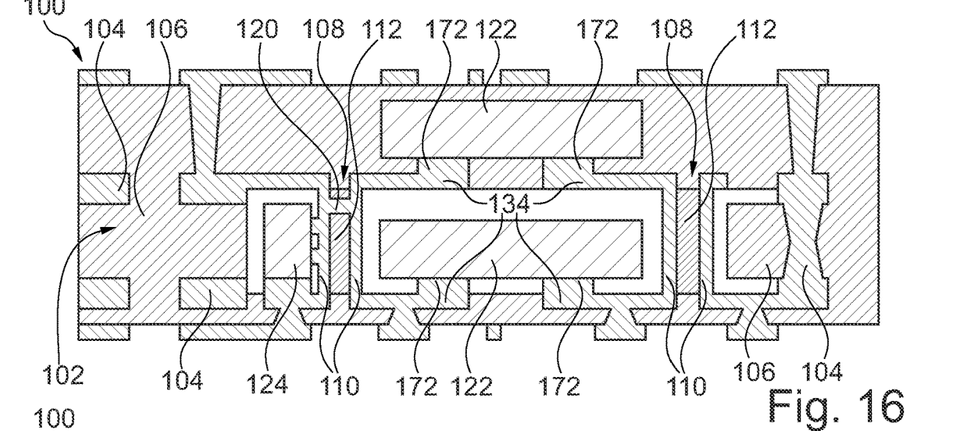

FIG. 16 illustrates an electronic device 100 according to still another exemplary embodiment. The embodiment of FIG. 16 differs from the embodiment of FIG. 15 in particular in that a second component carrier 108 with a vertically aligned component 124 is embedded in the electronic device 100 (compare description referring to FIG. 12 to FIG. 14). In other words, a package with component 124 on one of the second component carriers 108, embodied as vertical substrate, is provided.

Figure 17:
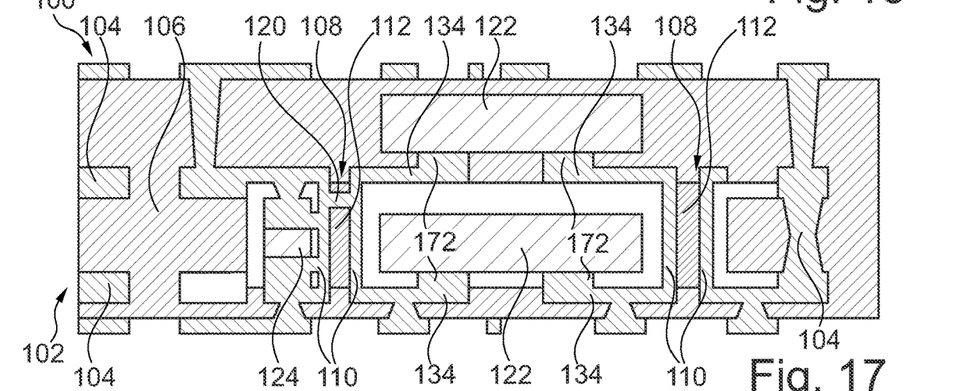

Referring to FIG. 17, an electronic device 100 according to another exemplary embodiment is shown which has a build up with an embedded component 124 forming part of one of the second component carriers 108. In the illustrated embodiment, component 124 may be embodied as a passive component such as a resistor (for instance with a laser connection on one side).

Figure 18:
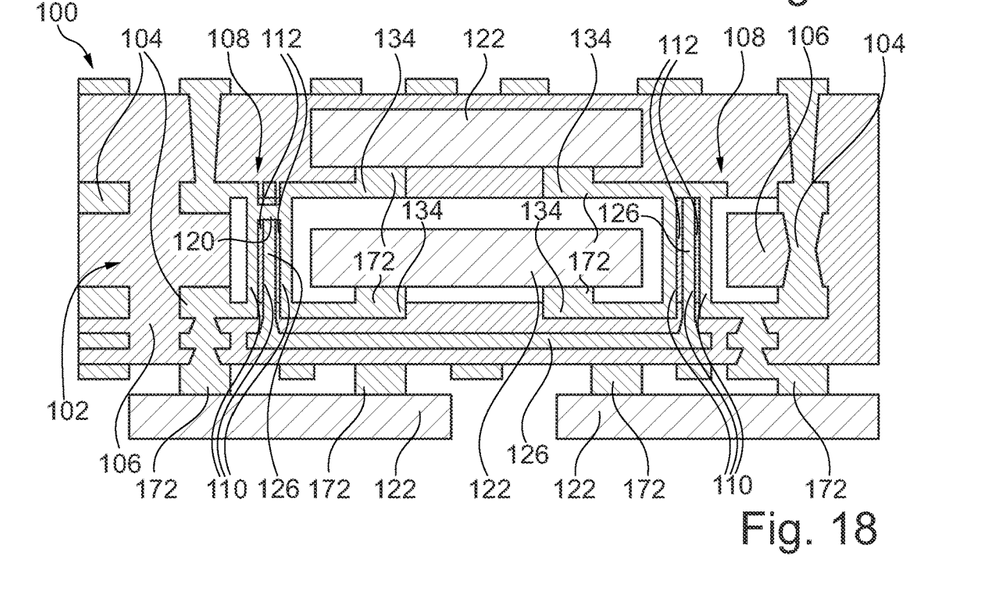

Referring to FIG. 18, an electronic device 100 according to still another exemplary embodiment is shown having a build up with an electromagnetic shielding structure 126. In the described embodiment, each of the second component carriers 108 comprises a continuous second electrically conductive layer structure 110 sandwiched between two second electrically insulating layer structures 112 and being made of an electromagnetic shielding material. The electromagnetic shielding structure 126, which has layer constituents in a horizontal direction (originating from the first component carrier 102) and in the vertical direction (originating from the second component carriers 108, see continuous second electrically conductive layer structures 110), is configured for shielding electromagnetic radiation from propagating between an interior and an exterior of the electronic device 100. The shielding structure 126 is partially formed by the horizontally oriented first component carrier 102 and is partially formed by the vertically oriented second component carriers 108. With the architecture of the shielding structure 126, it is also possible to establish impedance controlled electric connections. Descriptively speaking, the shielding structure 126 is formed in a cage like way and provides for a highly efficient shielding of RF radiation and therefore provides a reliable electromagnetic interference (EMI) protection. According to FIG. 18, the inner layer of the substrates can be routed to the next level of the board to build a shielding cage without limiting the possibilities of electrical interconnection.

Figure 19:
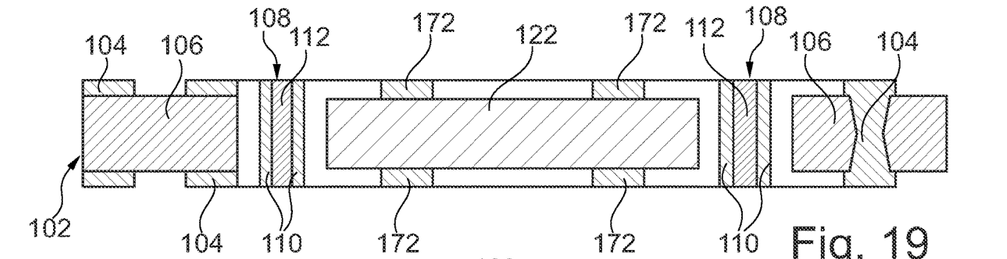
FIG. 19 illustrates a cross-sectional view of structures obtained during performance of a method of manufacturing an electronic device, shown in a cross-sectional view in FIG. 20, according to still another exemplary embodiment of the invention.
Figures 20, 21, 22:
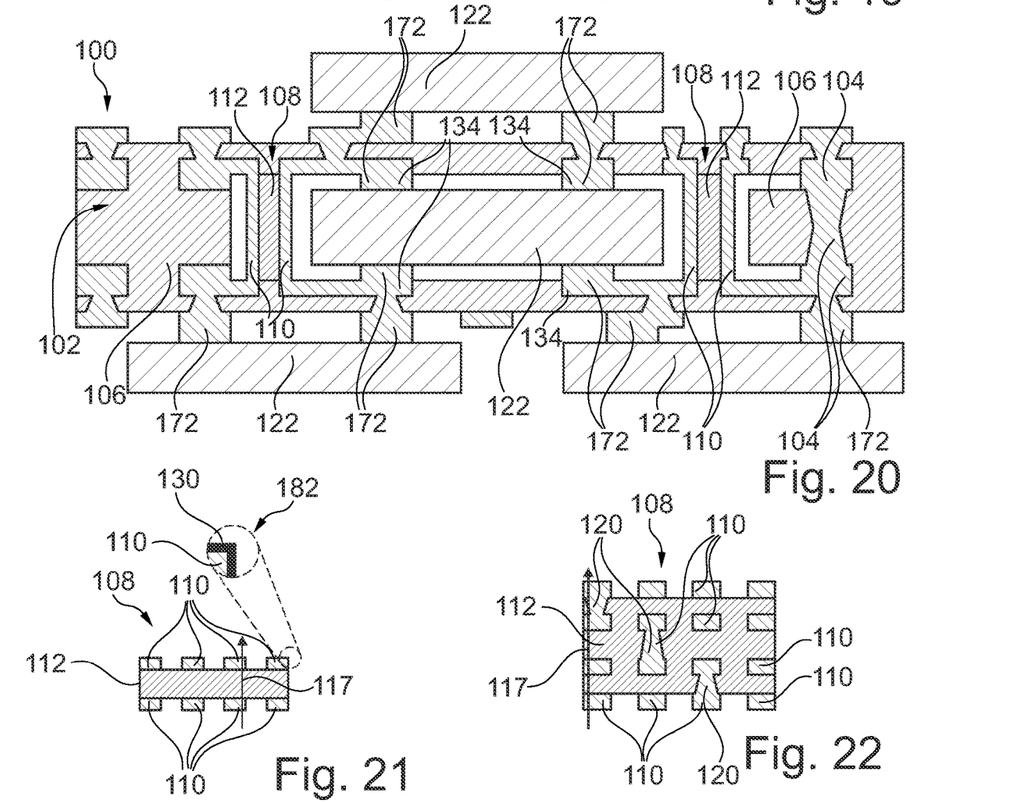
FIGS. 21, 22, 23 and 24 show cross-sectional views of second component carriers to be inserted in a cavity of or to be attached to a side wall of a first component carrier for manufacturing an electronic device according to an exemplary embodiment of the invention.

FIG. 19 and FIG. 20 illustrate cross-sectional views of structures obtained during performance of a method of manufacturing an electronic device 100 according to still another exemplary embodiment of the invention.

Referring to FIG. 19, a structure is shown which corresponds to the structure of FIG. 8 with the difference that electrically-conductive pads 172 are formed on both opposing main surfaces of the component 122 and are exposed towards an environment according to FIG. 19. Thus, a double-sided component 122 is integrated in an electronic device 100 according to FIG. 19. In such a scenario, the direct structuring can be done on both sides after grinding and/or cleaning.

Referring to FIG. 20, an electronic device 100 according to another exemplary embodiment is shown illustrating a possible build-up based on the double-sided component 122 according to FIG. 19.

FIG. 21 to FIG. 24 show cross-sectional views of second component carriers 108 to be inserted in a cavity 114 of a first component carrier 102 for manufacturing an electronic device 100 according to an exemplary embodiment of the invention. Alternatively, any of the second component carriers 108 shown in FIG. 21 to FIG. 24 can be attached to a lateral sidewall of a first component carrier 102 (compare for instance FIG. 25).

A starting point of a manufacturing method according to an exemplary embodiment of the invention may include providing one or more IC substrates as one or more second component carriers 108, preferably with high-density structures (for instance a line/space value L/S in a range from 1 µm to 30 µm). Such a second component carrier 108 can have one or more electrically conductive layer structures 110 (depending on the quantity of desired connections), which can be connected. Before dicing, it is also possible to place or integrate a component 124 on the substrate.

Referring to FIG. 21, a substrate-type second component carrier 108 with two second electrically conductive layer structures 110 on two opposing main surfaces of an electrically insulating layer structure 112 is shown, as described above.

As can be taken from a detail 182 in FIG. 21, an exposed surface of a respective one of the second electrically conductive layer structures 110 of the second component carrier 108 is covered with a corrosion protection 130. This prevents undesired corrosion of the copper surface when the shown second component carrier 108 is stored in a warehouse before being connected with a first component carrier 102.

Referring to FIG. 22, a substrate-type second component carrier 108 according to another exemplary embodiment of the invention is shown having an alternating sequence of four patterned metal foils (as second electrically conductive layer structures 110) and three dielectric layers (as second electrically insulating layer structures 112). Apart from this, two of the patterned metal foils are interconnected by an interlayer connect 120 (which may be embodied as copper filled laser via).

Figure 23:
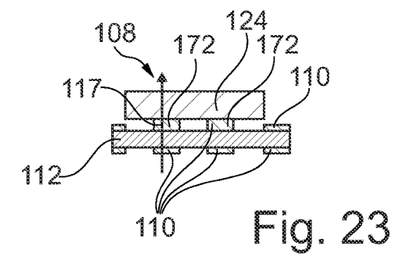

Referring to FIG. 23, another second component carrier 108 is illustrated being embodied as a substrate of the type shown in FIG. 21 and having a surface mounted component 124.

Figure 24:
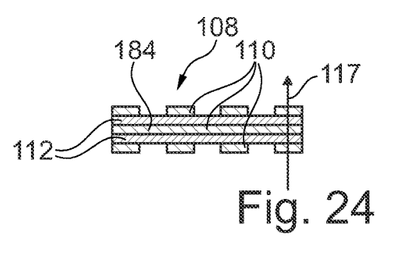

Referring to FIG. 24, still another second component carrier 108 is illustrated being embodied as a substrate of the type shown in FIG. 21 and having an intermediate functional layer 184 in its interior (such as a heat removal layer, an electromagnetic radiation shielding layer, an impedance controlled electric connection, etc.).

Preferably, the width of the diced boards shown in FIG. 21 to FIG. 24 can be substantially the same as the deepness of the cavity 114 of the first component carrier 102.

Figure 25:
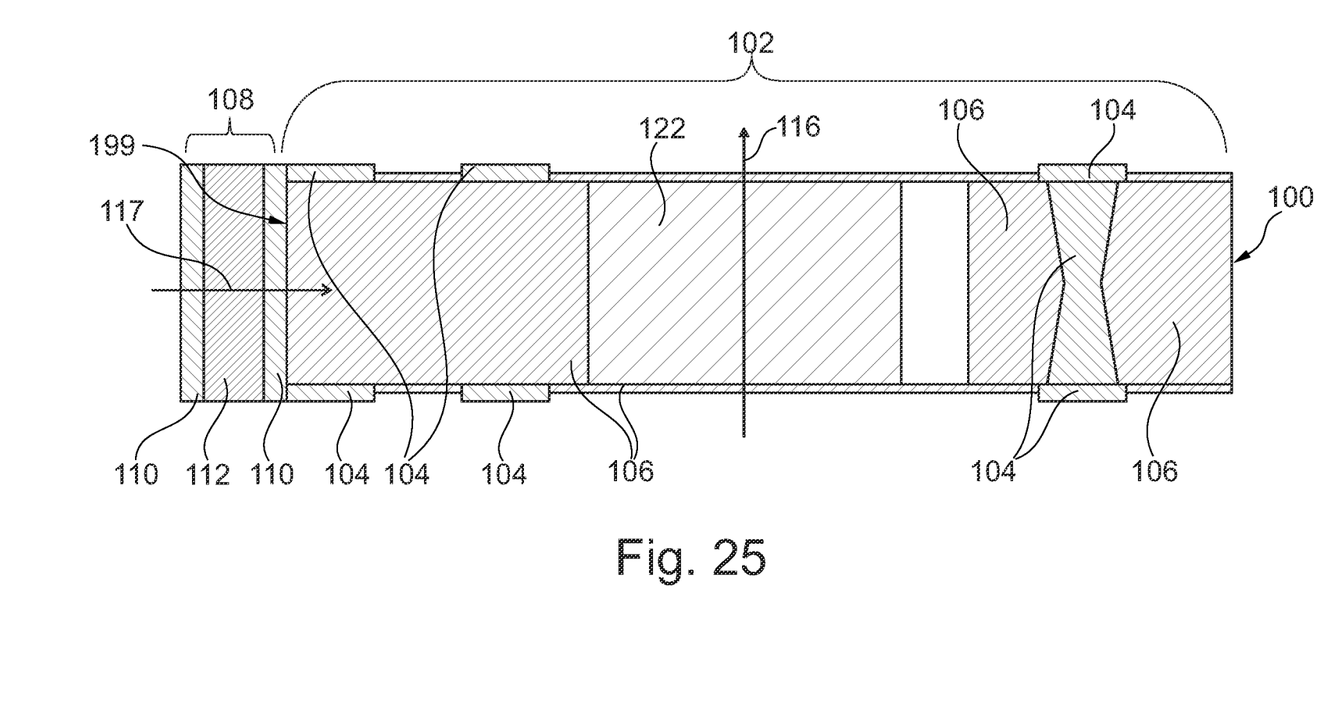
FIG. 25 illustrates a cross-sectional view of an electronic device according to another exemplary embodiment of the invention.

FIG. 25 illustrates a cross-sectional view of an electronic device 100 according to another exemplary embodiment of the invention. Contrary to the previously described embodiments, the electronic device 100 according to FIG. 25 may connect the second component carrier 108 to an exterior sidewall 199 of the first component carrier 102 (rather than placing it within a cavity 114 formed in the first component carrier 102). Thus, the embodiment of FIG. 25 is specifically simple, since cavity formation is dispensable. Moreover, it is also possible to attach (for instance by adhesive) multiple second component carriers 108 to different surface areas of the sidewall 199 of the first component carrier 102. Optionally it is also possible to mount one or more components on one or both of the opposing main surfaces of the first component carrier 102. Furthermore, it is possible to embed one or more components within the first component carrier 102. Any of the measures taken as described above referring to FIG. 1 to FIG. 24 may be applied in a corresponding way to the embodiment of FIG. 25.

It should be noted that the term "comprising" does not exclude other elements or steps and the "a" or "an" does not exclude a plurality. Also elements described in association with different embodiments may be combined.

Implementation of the invention is not limited to the preferred embodiments shown in the figures and described above. Instead, a multiplicity of variants are possible which use the solutions shown and the principle according to the invention even in the case of fundamentally different embodiments.

The invention claimed is:

1. An electronic device, comprising:
a first component carrier including a stack of at least one first electrically conductive layer structure and at least one first electrically insulating layer structure; and
a second component carrier including a respective stack of at least two second electrically conductive layer structures that sandwich at least one second electrically insulating layer structure and being connected to the first component carrier so that a first stacking direction of the first component carrier is angled with regard to a second stacking direction of the second component carrier;
wherein the second component carrier includes at least one electrically conductive interlayer connect extending between the at least two second electrically conductive layer structures through the sandwiched second electrically insulating layer structure of the second component carrier;
wherein the at least one electrically conductive interlayer connect is a via;
wherein the direction of main extension of the via is oriented parallel with the second stacking direction of the second component carrier;
wherein the first component carrier has a cavity and the second component carrier is inserted at least partially into the cavity, and
wherein the cavity is a recess in at least one of the following: the at least one first electrically conductive layer structure, the at least one first electrically insulating layer structure, a plurality of the stacked layer structures.

2. The electronic device according to claim 1, wherein the first stacking direction of the first component carrier has an angle with respect to the second stacking direction of the second component carrier in a range between 60° and 120°.

3. The electronic device according to claim 1, wherein the at least one second electrically conductive layer structure of the second component carrier includes to a large extent straight, an electrically conductive trace electrically connected with at least one of the at least one first electrically conductive layer structure with at least two electrically conductive layer structures, of the first component carrier.

4. The electronic device according to claim 1, wherein the second component carrier includes a further layer structure.

5. The electronic device according to claim 1, wherein the at least one electrically conductive interlayer connect is filled with electrically conductive material.

6. The electronic device according to claim 1, further comprising:
at least one first component embedded in and/or surface-mounted on the first component carrier, wherein the at least one first component is electrically coupled with the first one of the at least two second electrically conductive layer structures of the second component carrier.

7. The electronic device according to claim 6, wherein the second one of the at least two second electrically conductive layer structures of the second component carrier is electrically connected via the electrically conductive interlayer connect to the first one of the at least two electrically conductive layer structures of the second component carrier.

8. The electronic device according to claim 1, further comprising:
at least one second component being surface-mounted on and/or embedded in the second component carrier and being electrically coupled with the first component carrier.

9. The electronic device according to claim 1, comprising at least one of the following features:
wherein the at least one second electrically conductive layer structure of the second component carrier comprises a continuous electrically conductive layer sandwiched between two second electrically insulating layer structures;
wherein an electromagnetic shielding structure configured for shielding electromagnetic radiation from propagating between an interior and an exterior of the electronic device, wherein the shielding structure is at least partially formed by at least one of the first component carrier and the second component carrier;
wherein, in a viewing direction along a stacking direction of the first component carrier, at least a part of sidewalls of the second component carrier has an acute angle with a corresponding sidewall of the first component carrier;
wherein at least part of the at least one second electrically insulating layer structure of the second component carrier includes at least one of the group consisting of silicon, glass, ceramic, and an organic dielectric a resin;
wherein an exposed surface of at least one of the at least one second electrically conductive layer structure of the second component carrier is at least partially covered with a corrosion protection.

10. The electronic device according to claim 1, further comprising at least one of the following features:
the at least one first electrically conductive layer structure and/or the at least one second electrically conductive layer structure includes at least one of the group consisting of copper, aluminum, nickel, silver, gold, palladium, and tungsten, any of the mentioned materials being optionally coated with supra-conductive material such as graphene;
the at least one first electrically insulating layer structure and/or the at least one second electrically insulating layer structure includes at least one of the group consisting of resin, reinforced or non-reinforced resin, epoxy resin or Bismaleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide;
wherein the electronic device comprises at least one component embedded in and/or surface mounted on at least one of the first component carrier and the second component carrier, the at least one component selected from a group consisting of an electronic component, an electrically non-conductive and/or electrically conductive inlay, a heat transfer unit, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a light guiding element, a further component carrier and a logic chip;
at least one of the first component carrier and the second component carrier is shaped as a plate;
at least one of the first component carrier and the second component carrier is configured as a printed circuit board or a substrate.

11. An electronic device, comprising:
a first component carrier including a layer stack of at least two first electrically conductive layer structures and at least one first electrically insulating layer structure; and
a second component carrier including a respective stack of at least one second electrically conductive layer structure and at least one second electrically insulating layer structure and being connected to the first component carrier so that a first stacking direction of the first component carrier is angled with regard to a second stacking direction of the second component carrier;
wherein the second component carrier is directly connected to a lateral exterior sidewall of the layer stack, wherein the lateral exterior sidewall of the layer stack comprises the at least two first electrically conductive layer structures and the at least one first electrically insulating layer structure, of the first component carrier; and
wherein the length of extension of the second component carrier along the first stacking direction of the first component carrier is equal to a thickness of the first component carrier in the first stacking direction of the first component carrier.

12. A method of manufacturing an electronic device, the method comprising:
providing a first component carrier having a stack of at least one first electrically conductive layer structure and at least one first electrically insulating layer structure, the first component carrier forming a cavity; and connecting a second component carrier having a respective stack of at least two second electrically conductive layer structures that sandwich at least one second electrically insulating layer structure, the second component carrier connected with the first component carrier so that a first stacking direction of the first component carrier is angled relative to a second stacking direction of the second component carrier, wherein the second component carrier is inserted at least partially in the cavity with the cavity being a recess in one of the at least one first electrically conductive layer structure, the at least one first electrically insulating layer structure, a plurality of the stacked layer structures, wherein the second component carrier includes at least one electrically conductive interlayer connect extending between the at least two second electrically conductive layer structures through the sandwiched second electrically insulating layer structure of the second component carrier, wherein the at least one electrically conductive interlayer connect is a via;

wherein the direction of main extension of the via is oriented parallel with the second stacking direction of the second component carrier.

13. The method according to claim 12, wherein the method further comprises:

inserting a component in the cavity side by side with the second component carrier by placing the component in the cavity between two second component carriers having the second stacking direction angled with regard to the first stacking direction of the first component carrier.

14. The method according to claim 12, wherein the method further comprises:

fixing the second component carrier in the cavity by at least one of the group consisting of adhering the second component carrier in the cavity by adhesive material, placing the second component carrier on a temporary carrier, equipping the second component carrier with a temporary carrier before placing, and laminating an at least partially uncured electrically insulating layer structure to the first component carrier.

15. The method according to claim 12, wherein the method further comprises:

connecting the second component carrier to an exterior sidewall of the first component carrier.

16. The method according to claim 12, wherein the method further comprises:

connecting at least one electrically conductive layer structure to the first component carrier and the second component carrier for establishing an electrically conductive connection between at least one of the at least two second electrically conductive layer structures of the second component carrier on the one hand and at least one of the group consisting of the at least one first electrically conductive layer structure of the first component carrier and a component embedded in the first component carrier on the other hand.

17. The method according to claim 12, wherein the method further comprises:

forming, after inserting the second component carrier in the cavity, a further cavity in the first component carrier; and inserting a component or a third component carrier in the further cavity.

18. The method according to claim 12, wherein the method further comprises:

only after connecting the second component carrier with the first component carrier, forming the at least two second electrically conductive layer structures of the second component.

* * * * *